United States Patent
Kühn

(10) Patent No.: US 11,101,797 B2
(45) Date of Patent: *Aug. 24, 2021

(54) OSCILLATION SENSOR WITH CALIBRATION UNIT AND MEASUREMENT DEVICE

(71) Applicant: Pepperl+Fuchs GmbH, Mannheim (DE)

(72) Inventor: Thomas Kühn, Mannheim (DE)

(73) Assignee: Pepperl+Fuchs SE

( * ) Notice: Subject to any disclaimer, the term of this patent is extended or adjusted under 35 U.S.C. 154(b) by 0 days.

This patent is subject to a terminal disclaimer.

(21) Appl. No.: 16/661,138

(22) Filed: Oct. 23, 2019

(65) Prior Publication Data

US 2020/0136615 A1    Apr. 30, 2020

(30) Foreign Application Priority Data

Oct. 25, 2018  (DE) ...................... 10 2018 126 642.1

(51) Int. Cl.
| | | |
|---|---|---|
| *G01N 27/00* | (2006.01) | |
| *G08B 19/00* | (2006.01) | |
| *G08B 21/00* | (2006.01) | |
| *H03K 17/95* | (2006.01) | |
| *H03B 5/04* | (2006.01) | |

(52) U.S. Cl.
CPC .......... *H03K 17/9545* (2013.01); *H03B 5/04* (2013.01); *H03K 17/9547* (2013.01); *H03K 2217/94031* (2013.01)

(58) Field of Classification Search
CPC .......... H03K 17/9545; H03K 17/9547; H03K 2217/94031; H03B 5/04; G01R 27/267; G01V 3/101

USPC ........................................................... 331/65
See application file for complete search history.

(56) References Cited

U.S. PATENT DOCUMENTS

| | | |
|---|---|---|
| 2006/0221646 A1 | 10/2006 | Ye |
| 2010/0225332 A1 | 9/2010 | Niwa |
| 2018/0123587 A1 | 5/2018 | Kühn |
| 2020/0136616 A1* | 4/2020 | Vater .................. H03K 17/9545 |

FOREIGN PATENT DOCUMENTS

| | | | |
|---|---|---|---|
| WO | 2016141965 A1 | 9/2016 | |
| WO | WO2016141965 | * | 9/2016 |

* cited by examiner

*Primary Examiner* — Richard Tan
(74) *Attorney, Agent, or Firm* — Blueshift IP, LLC; Robert Plotkin

(57) ABSTRACT

The present invention relates to an oscillating sensor for a measurement device comprising:
  an oscillator comprising
    a resonance circuit for providing an oscillation signal;
    a gain stage configured to feedback to the resonance circuit to inject energy for excitation of the resonance circuit to maintain oscillation;
    at least one calibration element to adjust the open loop gain of the oscillator;
  a calibration unit to provide a modulated calibration control signal to selectively adjust an electrical measure of the at least one calibration element based on at least one predetermined duty cycle,
wherein the modulated calibration control signal has an irregularly time-varying cycle frequency.

20 Claims, 5 Drawing Sheets

OSCILLATION SENSOR WITH CALIBRATION UNIT AND MEASUREMENT DEVICE

TECHNICAL FIELD

The present invention relates to measurement devices with oscillation sensors. Particularly, the present invention relates to calibrating oscillation sensors using a modulated calibration element.

TECHNICAL BACKGROUND

Oscillation sensors are often used to detect a change of impedance or attenuation caused by various physical effects. Oscillation sensors usually have an oscillator including a resonance circuit formed with a sensing coil and/or with a sensing capacitor.

Particularly, oscillation sensors are commonly applied e.g. for proximity sensors where the presence, non-presence of a conductive object in or movement of a conductive object within a sensing range of a sensing coil shall be detected. During operation, such an oscillator oscillates while the sensing coil produces an alternating magnetic field which is substantially affected by the presence of conductive objects. Therefore, conductive objects which enter or leave a sensing range of the sensing coil or move in or out of the sensing range produce a change of their impedance of the sensing coil.

During operation the resonance circuit has a resonance frequency which is determined by the inductance of the sensing coil and by the capacitance of the capacitor. By means of a feedback amplification, the resonance circuit is excited so that the oscillation is maintained by injecting energy in phase with the oscillation. Further, the presence of an object in the sensing range leads to a decrease of a quality factor of the resonance circuit caused by an energy loss due to the production of eddy currents in the object. In operation this results in a change of oscillation frequency of the excited oscillation and in a change of the amplitude of oscillation.

For instance, in applications where the presence, non-presence or movement of objects shall be detected often the amplitude variation is analyzed. Therefore, the characteristics of the feedback amplification is usually configured to obtain a high sensitivity regarding an amplitude change with respect to a change of resonance characteristics due to the presence of an object in the sensing range.

Calibration of the sensitivity of such an oscillation sensor and setting of the operating point is usually made by means of a variable calibration element which may be a passive electrical component in the feedback loop used for excitation of the oscillation. The calibration element may be a resistor or the like. As laser calibration of such a calibration element is expensive and does not allow recalibration, electronic calibration is preferred.

For example, document WO2016/141965 A1 relates to an oscillator with resonance circuit and a feedback gain stage. In a feedback loop an adjustment resistor is provided which is configured to be coupled into the feedback loop by means of a switch. An effective resistance of the adjustment resistor can be set for calibration by controlling the switch by means of a duty cycle of pulse width modulated control signal.

The calibration of the oscillation sensor is initially made by tuning an electrical quantity of the calibration element. If the calibration element is a switchable adjustment resistor which is controlled by a pulse width modulated signal, the duty cycle determines an effective resistance for the feedback coupling.

However, control via a pulse width modulation has the potential to inject low frequency harmonics into the circuitry which are essentially determined by the cycle frequency of the pulse width modulation and the specific duty cycle. These harmonics cannot be easily separated from the sensor signal and affect the operation of the oscillation sensor so that the signal-to-noise ratio is essentially degraded. As it depends on the calibration of what duty cycle is selected different harmonics are introduced into each oscillation sensor so that they are difficult to eliminate by filtering.

It is therefore an object of the present invention to provide a tunable oscillation sensor and a measurement device which can be calibrated by a variable calibration element and wherein a negative effect of a modulation injected by a pulse width modulation signal can be reduced to achieve a high signal-to-noise ratio.

SUMMARY OF THE INVENTION

Above object has been achieved by the oscillation sensor according to claim 1 and the measurement device and the method for operating the oscillation sensor according to the further independent claims.

Further embodiments are indicated in the depending subclaims.

According to a first aspect an oscillating sensor for a measurement device is provided comprising:
  An oscillator comprising
    a resonance circuit for providing an oscillation signal;
    a gain stage configured to feedback to the resonance circuit to inject energy for excitation of the resonance circuit to maintain oscillation; and
    at least one calibration element to control the open loop gain of the oscillator;
  a calibration unit to provide a modulated calibration control signal to selectively adjust an electrical measure of the at least one calibration element based on at least one predetermined duty cycle,
wherein the modulated calibration control signal has an irregularly time-varying cycle frequency.

In the above oscillation sensor, an electronic calibration is provided by coupling and decoupling a calibration element controlled by a calibration control signal to provide an effective electrical measure of the calibration element. Setting the effective electrical measure allows to calibrate the oscillation sensor with respect to high sensitivity and the operating point. The calibration control signal is provided as a pulse width modulation signal wherein the electrical measure is determined by a duty cycle. Therefore, calibration can be made by selecting the duty cycle appropriately.

In the above oscillation sensor the calibration element controls the amount of energy used for exciting oscillation of the resonance circuit by controlling the open loop gain of the oscillator. The open loop gain is defined as the gain resulting from a ratio of the voltage amplitude of the oscillation at the resonance circuit and a variable amplitude at the amplifier input, i.e. the total gain resulting from an opened connection between the resonance circuit to the gain stage input. As the at least one calibration element is controlled by the pulse width modulation signal its cycle frequency superimposes the oscillation of the resonance circuit. In the common case where the oscillation frequency does not correspond to an integer multiple of the cycle frequency it results in a modulation effect on the amplitude of the oscillation. Where the sensor signal amplitude is used as the measurement signal of the oscillation sensor this would result in a substantial decrease of the signal-to-noise ratio.

One idea of the present invention is to provide the respective calibration control signal as a pulse width modulation signal with irregularly varying cycle frequencies over time or over succeeding PWM cycles. Compared with a standard pulse width modulation scheme the above method allows to reduce the modulation effect as the variation of the injected energy used for excitation in each cycle is made random so that no predominant frequency is generated overlaying the amplitude signal. By irregularly varying the cycle frequency over time, no specific frequency is introduced into the amplitude characteristics of the oscillation sensor which substantially improves the signal-to-noise ratio of the amplitude signal derived therefrom. The term "irregularly varying" shall be understood herein as a steadily differing variation of succeeding cycle frequency changes between succeeding cycles. For instance, the term "irregular" may include that at least two, at least three, at least four or at least five successive cycle frequency changes are different from each other Already by using two different successive cycle frequency changes which do not result in harmonic cycle frequencies, a signal-to-noise ratio can be essentially improved.

Furthermore, the modulated calibration control signal may correspond to a pulse width modulation signal.

Furthermore, the calibration element may be configured to be controlled by a modulated calibration feedback control signal wherein particularly the calibration element includes a passive electrical component, particularly a resistor, and a switch controlled by the modulated calibration feedback control signal.

Additionally or alternatively, the calibration element may include a gain control element to be controlled by a modulated calibration gain control signal for adjusting the gain of the gain stage wherein particularly the calibration element may include a resistor and a switch controlled by the modulated calibration gain control signal.

According to an embodiment the calibration unit is configured to maintain duty cycle while varying the cycle frequency.

Moreover, the calibration unit may be configured to cyclically vary the cycle frequency after each one, two or three to five cycles of the modulation of the calibration control signal.

It may be provided that the calibration unit is configured to cyclically vary the cycle frequency according to a predetermined set of evenly distributed cycle frequencies.

Particularly, the calibration unit may be configured to provide the set of evenly distributed cycle frequencies by means of a pseudo-random shift register providing pseudo-random numbers and to associate a corresponding cycle frequency to each of the pseudo-random numbers.

According to an embodiment, the resonance circuit may have a sensing coil and/or a sensing capacitor.

According to another aspect, a measurement device is provided comprising an oscillating sensor and an analyzing circuit which is configured to receive an indication of the oscillation signal and to provide an amplitude signal as a sensor signal indicating the amplitude of the oscillation signal.

Furthermore, the resonance circuit may have a sensing coil for detecting a conductive object being in a sensing range of the sensing coil.

According to a further aspect, a method for operating an oscillation sensor is provided comprising an oscillator comprising a resonance circuit for providing an oscillation signal, a gain stage configured to feedback to the resonance circuit to inject energy for excitation of the resonance circuit to maintain oscillation, and a calibration element to adjust the open loop gain of the oscillator, wherein an electrical measure of the calibration element is adjusted based on a predetermined duty cycle of a modulated calibration control signal wherein the modulated calibration control signal has a varying cycle frequency.

BRIEF DESCRIPTION OF THE DRAWINGS

Embodiments are described in more detail in conjunction with the accompanying drawings in which.

BRIEF DESCRIPTION OF EMBODIMENTS

Figure 1:
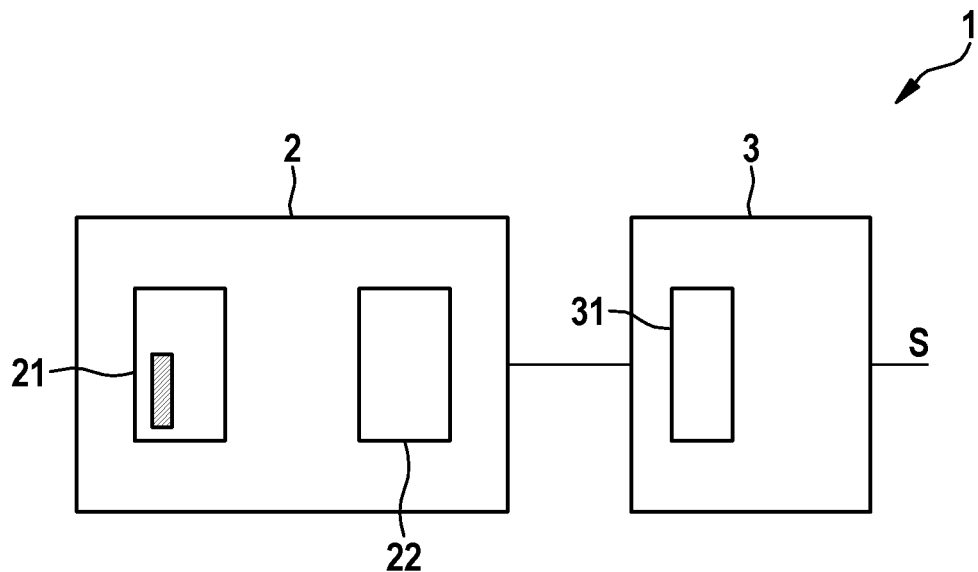
FIG. 1 shows a schematic view of a proximity sensor including an inductive sensor.

FIG. 1 schematically shows a measurement device with an oscillating sensor 2 and an analyzing circuit 3 to analyze an amplitude of an oscillation signal of an oscillation of the oscillation sensor 2 and to generate a sensor signal S. The oscillating sensor 2 has a resonance circuit 21 and an amplifier 22 forming an oscillator.

The analyzing unit 3 may substantially include an amplitude determination circuit 31 which provides an amplitude signal as a sensor signal representing the amplitude of the oscillation.

The resonance circuit 21 has an inductor which may be provided as a sensing coil. In operation, the resonance circuit 21 oscillates and generates an alternating magnetic field in a sensing range around the sensing coil. The alternating magnetic field is affected by any conductive objects being present or moving through the sensing range. This is caused by eddy currents which are induced in the conductive objects in the sensing range so that energy is withdrawn from the resonance circuit 21. This energy loss affects in a change of inductance of the sensing coil and in an attenuation of the oscillation. Due to the changed attenuation of the resonance circuit 21, the amplitude of oscillation may vary depending on the presence or non-presence of a conductive object in the sensing range.

Figure 2:
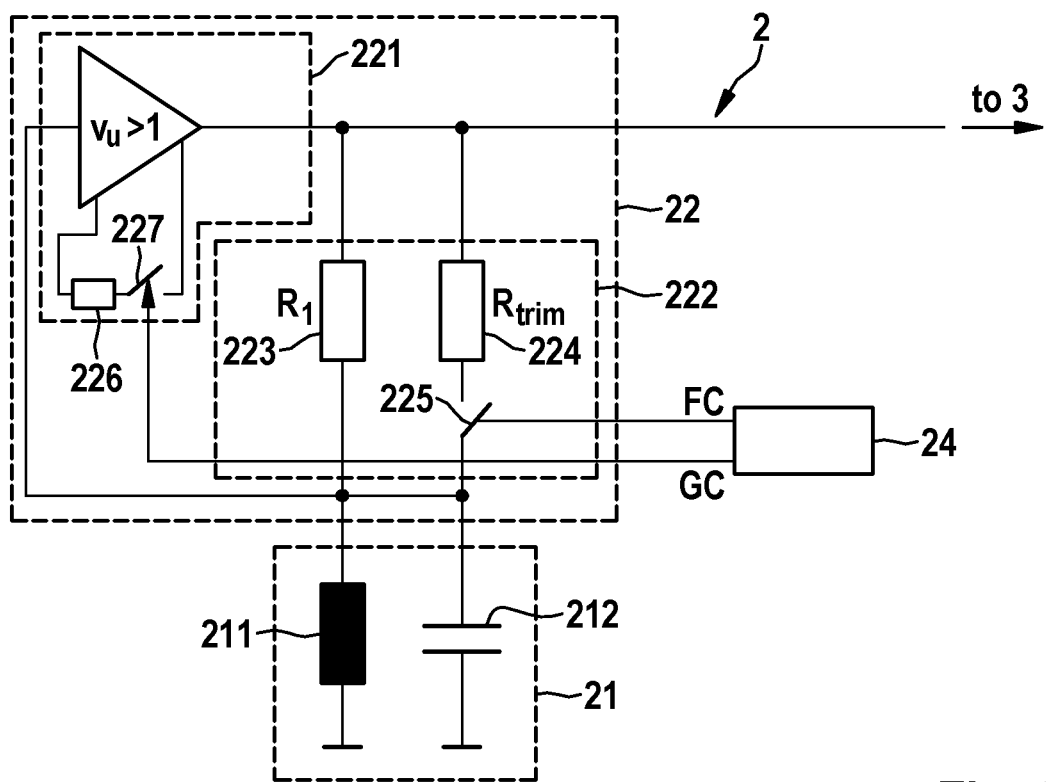
FIG. 2 shows a more detailed schematic view of an inductive sensor with a calibration unit.

In FIG. 2, the inductive sensor 2 is shown in more detail. An oscillator is formed with a resonance circuit 21 with the sensing coil 211 and a capacitor 212 while the amplifier 22 has a gain stage 221 with a gain of larger than 1 and a feedback circuit 222. In the shown embodiment, the feedback circuit 222 comprises a first resistor 223 with a resistance of R1 and a second resistor 224 with a resistance of $R_{trim}$ which is in series with a first calibration switch 225.

The first calibration switch 225 may be implemented as any kind of electronic switch such as a MOSFET transistor or bipolar transistor.

The second resistor 224 and the first calibration switch 225 act together as a calibration resistor (calibration element) which may be controlled by a modulated calibration feedback control signal FC to adjust the feedback coupling between the gain stage 221 and the resonance circuit 21.

The gain of the gain stage 221 can be adjusted by means of a further calibration element which may include a gain control element to be controlled by a modulated calibration gain control signal GC for adjusting the gain of the gain stage 221. The gain control element can be generally of any kind so that the gain of the gain stage 221 is controlled by the duty cycle of the modulated calibration gain control signal GC. In the given example, the gain control element may include a calibration element 226, 227 which may comprise a third resistor 226 with a resistance of $R_{gain}$ and a second calibration switch 227. The second calibration switch 227 is controlled by the modulated calibration gain control signal GC. The second calibration switch 227 may be implemented as any kind of electronic switch such as a MOSFET transistor or bipolar transistor. In other embodiments, the gain stage 221 can be configured to be controlled by the modulated calibration gain control signal GC without switching of a resistor.

In general, the calibration element of the feedback circuit 222 and/or of the calibration element of the gain stage 221 can be formed as a resistor network comprising a switch, so that the resistance of the resistor network can be switched between two different resistance values (including a very high/infinite resistance value) by the respective control signal FC, GC. Therefore, the arrangement of the switch with respect to the resistors can be any combination of parallel and serial connection.

A calibration unit 24 is provided for providing the modulated calibration feedback control signal FC to a control terminal of the first calibration switch 225 to control the first calibration switch 225 to open or to close and/or for providing the modulated calibration gain control signal GC to a control terminal of the second calibration switch 227 to control the second calibration switch 227 to open or to close.

By controlling the first calibration switch 225, the effective resistance of the feedback circuit 222, particularly the effective resistance of the series of the calibration switch and second resistor 224 can be controlled. To vary the effective resistance of the second resistor 224, the first calibration switch 225 is controlled by a pulse width modulation (PWM) signal having a cycle frequency $f_{PWM}$ and a duty cycle DC. Analogously, by controlling the second calibration switch 227, the gain of the gain stage 221 can be controlled. To vary the effective resistance formed by the third resistor 226 and the second calibration switch 227 the second calibration switch 227 is controlled by a pulse width modulation (PWM) signal having a cycle frequency $f_{PWM}$ and a duty cycle DC.

The cycle frequency $f_{PWM}$ is determined by a cycle time which is defined as a total period including a first time in which the calibration switch is closed and a second time in which the calibration switch is open. The duty cycle indicates a ratio of the first time in which the calibration switch is closed by the cycle time. The control with a pulse width modulated control signal results in an effective resistance of the second resistor 224 determined as a quotient of the resistance of the second resistor 224 and the duty cycle.

The calibration is made by determining an appropriate duty cycle to set the effective resistance of the second resistor 224. This calibration is usually made initially and will be maintained until a recalibration will be carried out. Moreover, adjustments in calibration may be made continuously or regularly for compensating on short-termed influences such as temperature or the like.

Figure 3B:
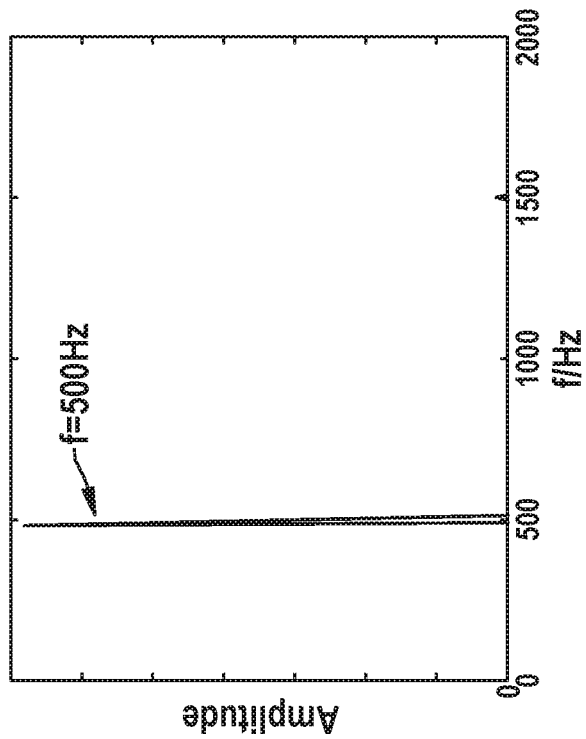
FIGS. 3a and 3b show examples for the impact of modulation when a single modulation cycle frequency is used.
Figure 3A:
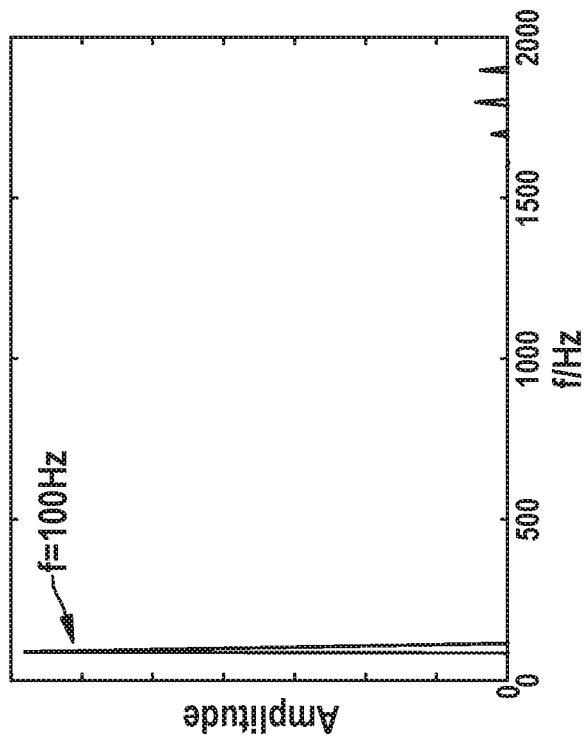

FIGS. 3a and 3b show exemplary Fourier diagrams of characteristics of the amplitude modulation of the energy injection into the resonance circuit 21 versus frequency of modulation of energy injection for an exemplary measurement device. As it is illustrated the cycle frequency $f_{PWM}$ of the pulse width modulation is 25 kHz, the duty cycle 0.3 and the oscillation frequency $f_{osc}$ are 100.05 and 100.25 kHz, respectively, and a low frequency range of the amplitude modulations onto the oscillation signal is shown. It can be seen that due to the PWM controlled feedback circuit 222 there will be produced a modulation frequency of 100 Hz and 500 Hz, respectively, of amplitude modulation onto the oscillation signal of the resonance circuit 21 depending on the selection of the cycle frequency $f_{PWM}$ and depending on the frequency of the oscillation signal. The signal portion of the low frequency amplitude modulations onto the oscillation signal cannot be filtered out as it belongs to the frequency range where the oscillation signal is analyzed to obtain the sensor signal.

Figure 4B:
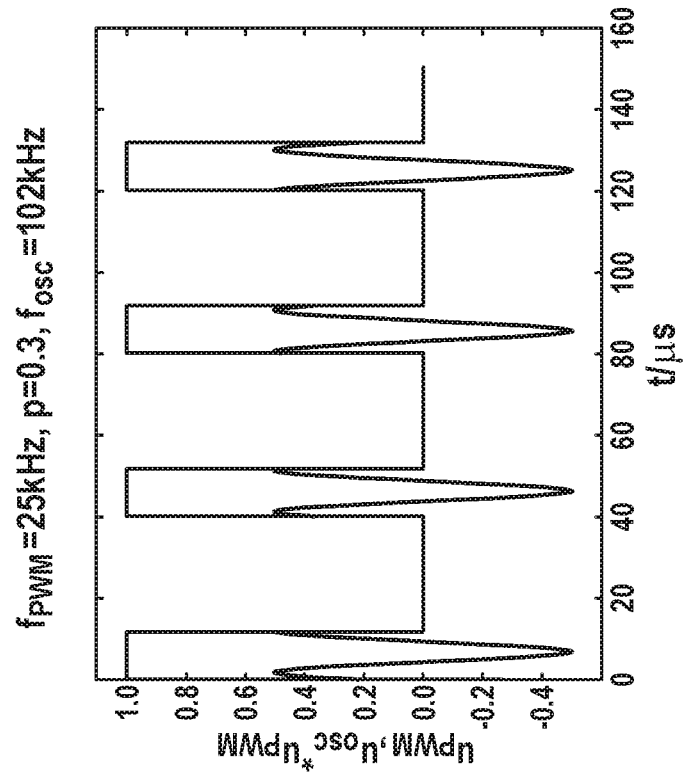
FIGS. 4a and 4b show a signal diagram including the oscillator signal and the calibration control signal in case of harmonic and disharmonic excitation.
Figure 4A:
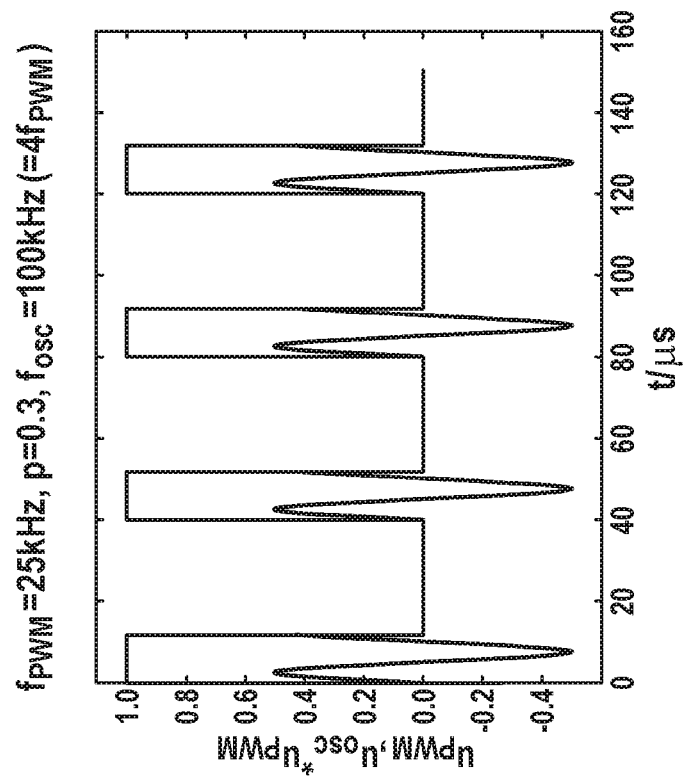

The development of low frequency amplitude modulations onto the oscillation signal generated by the pulse width modulated energy injection can be explained in view of the diagrams of FIGS. 4a and 4b. FIGS. 4a and 4b show the characteristics of the duty cycle signal ($U_{PWM}$) and the product of the duty cycle and the oscillation frequency signal ($U_{osc}*U_{PWM}$). As shown in FIG. 4a where the oscillation frequency is an integer multiple of the cycle frequency it can be seen from the same characteristics of the oscillation signal in the duty cycle window that no modulation of the energy injection into the resonance circuit 21 is caused since the energy injection into the resonance circuit 21 has the same phase and therefore has the same amount for all cycles.

However, as illustrated in FIG. 4b, since the oscillation frequency usually cannot be exactly set to be an integer multiple of the cycle frequency $f_{PWM}$ of the pulse width modulation, a modulation of the energy injection into the resonance circuit 21 will be incurred so that an amplitude modulation with a modulation frequency $f_{mod}=2$ ($f_{osc}$-n× $f_{PWM}$) will be generated. The modulation can be seen from the differing characteristics of the oscillation signal modulation in the duty cycle window. While the modulation is not directly shown in the Figures it can be seen that the injection of energy is not equal for every phase angle of the sinusoidal oscillation which may result in slowly varying phase shift between the pulse width modulation and the oscillation forming a low frequency modulation of the oscillation amplitude.

To avoid the generation of an amplitude modulation of the energy injection into the resonance circuit 21 the cycle frequency $f_{PWM}$ of the pulse width modulation is varied. By permanently changing of the cycle frequency $f_{PWM}$, the amplitude modulation can be significantly reduced and spread over the frequency spectrum so that resonance energy injection into the resonance circuit 21 is reduced. The change of the cycle frequency $f_{PWM}$ can be applied after every cycle of the pulse width modulation or after a low number of cycles such as between 2 to 5 cycles.

By applying a set of a high number of different cycle frequencies for carrying out the pulse width modulation by means of the calibration feedback control signal and/or the gain control signal GC, the cycle frequency $f_{PWM}$ can be evenly spread in a given range of cycle frequencies which results in a substantially even distribution of energy injection.

Figures 5A, 5B:
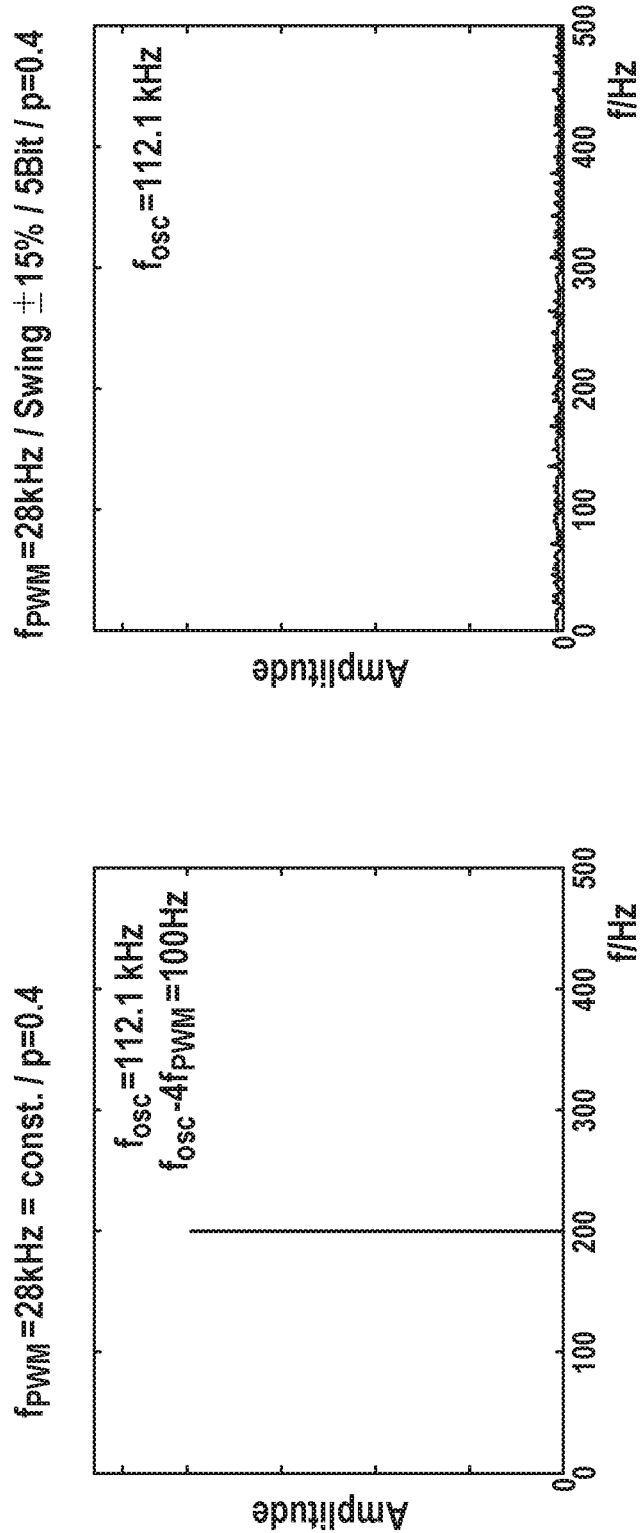
FIGS. 5a and 5b show a comparison of cases where the cycle frequency is not varied and where 32 different cycle frequencies are randomly applied.

FIGS. 5a and 5b show further exemplary Fourier diagrams of a characteristics of the amplitude of modulation of the energy injection into the resonance circuit 21 versus frequency of modulation of energy injection. As shown in comparison in FIGS. 6a and 6b in a case where the cycle frequency $f_{PWM}$ is not varied and, in a case, where 32 different cycle frequencies are successively applied, respectively. It can be seen that in the latter case the modulation amplitude is low.

The consecution of the different cycle frequencies can be random, pseudorandom or predetermined, however an even distribution around a preferred cycle frequency $f_{PWM}$, e.g. in a range of ±15% (swing) of a predetermined cycle frequency $f_{PWM}$ may be preferred.

Figure 6:
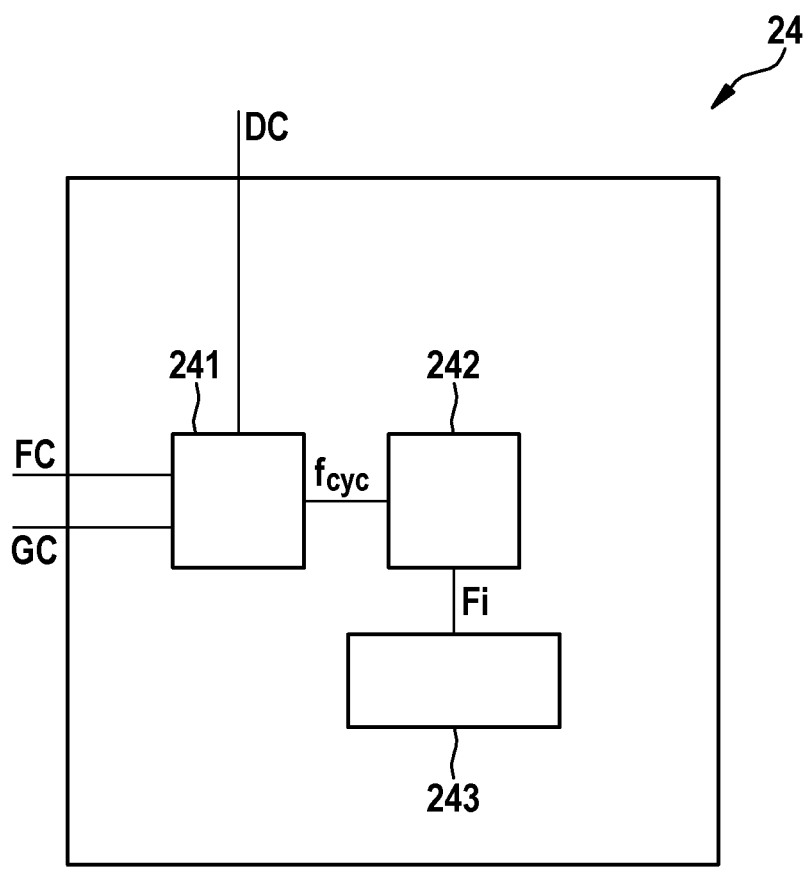
FIG. 6 an embodiment of the configuration of the calibration unit.

In FIG. 6 an embodiment of the calibration unit 24 is shown. The calibration unit 24 includes a cycle frequency oscillator 242 which supplies a cycle frequency signal $f_{PWM}$ to a PWM unit 241 which supplies one or more pulse width modulation signals as the calibration feedback control signal FC and/or calibration gain control signal GC depending on a respective duty cycle DC. The cycle frequency oscillator 242 obtains a frequency indication FI and generates the corresponding cycle frequency signal $f_{PWM}$. The frequency indication FI is provided by the frequency change unit 243.

The frequency change unit 243 may include a table of randomly distributed frequencies which may be cyclically polled.

Alternatively, the frequency change unit 243 may include a linear feedback shift register which pseudo-randomly generates numbers n between 0 and $2^N-1$ wherein N corresponds to the number of registers used. In operation the linear feedback shift register generates random numbers in series whose pseudo-random output repeats in cycles of between 2 and $2^N-1$.

The pseudo-random output can be directly derived/tapped from outputs of a part of the latches or all latches of the linear feedback shift register or generated by additional logic depending on the outputs of a part or all of the latches of the linear feedback shift register. Such a linear feedback shift register is well known in the art and may output binary values which are substantially evenly distributed in the number range 0 . . . $2^N-1$ and can be used as a pseudo-random sequence of binary values. Preferably the linear feedback shift register is configured to have a repetition of the succession of binary values higher than 10,000. The frequency indication FI may then be calculated by a base frequency $f_{bas}$ and the product of the number n and an incremental frequency $\Delta f$, such as FI=$f_{bas}$+n×$\Delta f$.

The invention claimed is:

1. Oscillating sensor for a measurement device comprising:
   an oscillator comprising,
      a resonance circuit for providing an oscillation signal;
      a gain stage configured to feedback to the resonance circuit to inject energy for excitation of the resonance circuit to maintain oscillation;
      at least one calibration element to adjust an open loop gain of the oscillator;
      a calibration unit to provide a modulated calibration control signal to selectively adjust an electrical measure of the at least one calibration element based on at least one predetermined duty cycle,
   characterized in that
      the modulated calibration control signal has an irregularly time-varying cycle frequency,
      wherein the irregularly time-varying cycle frequency is carried out without having an effect on the at least one predetermined duty cycle.

2. The oscillating sensor according to claim 1, wherein the modulated calibration control signal corresponds to a pulse width modulation signal.

3. The oscillating sensor according to claim 1, wherein the at least one calibration element is configured to be controlled by a modulated calibration control signal wherein particularly the at least one calibration element includes a passive electrical component, particularly a resistor, and a switch controlled by the modulated calibration control signal.

4. The oscillating sensor according to claim 1, wherein the at least one calibration element includes a gain control element to be controlled by a modulated calibration gain control signal for adjusting a gain of the gain stage wherein particularly the at least one calibration element includes a resistor and a switch controlled by the modulated calibration gain control signal.

5. The oscillating sensor according to claim 1, wherein the calibration unit is configured to maintain the at least one predetermined duty cycle while varying the irregularly time-varying cycle frequency.

6. The oscillating sensor according to claim 5, wherein the at least one predetermined duty cycle includes a predefined sequence of two duty cycles cyclically applied.

7. The oscillating sensor according to claim 1, wherein the calibration unit is configured to cyclically vary a predetermined cycle frequency according to a predetermined set of evenly distributed cycle frequencies.

8. The oscillating sensor according to claim 5, wherein the calibration unit is configured to cyclically vary a predetermined cycle frequency according to a predetermined set of evenly distributed cycle frequencies.

9. The oscillating sensor according to claim 1, wherein the calibration unit is configured to provide succeeding cycle frequencies wherein a predetermined cycle frequency differences between at least two, at least three, at least four or at least five successive cycle frequency changes are different from each other.

10. The oscillating sensor according to claim 5, wherein the calibration unit is configured to provide succeeding cycle frequencies wherein a predetermined cycle frequency differences between at least two, at least three, at least four or at least five successive cycle frequency changes are different from each other.

11. The oscillating sensor according to claim 8, wherein the calibration unit is configured to provide succeeding cycle frequencies wherein a predetermined cycle frequency differences between at least two, at least three, at least four or at least five successive cycle frequency changes are different from each other.

12. The oscillating sensor according to claim 1, wherein the calibration unit is configured to cyclically vary a predetermined cycle frequency after each one, two or three to five cycles of a modulation of the modulated calibration control signal.

13. The oscillating sensor according to claim 5, wherein the calibration unit is configured to cyclically vary a predetermined cycle frequency after each one, two or three to five cycles of a modulation of the modulated calibration control signal.

14. The oscillating sensor according to claim 7, wherein the calibration unit is configured to cyclically vary a predetermined cycle frequency after each one, two or three to five cycles of a modulation of the modulated calibration control signal.

15. The oscillating sensor according to claim 9, wherein the calibration unit is configured to cyclically vary a predetermined cycle frequency after each one, two or three to five cycles of a modulation of the modulated calibration control signal.

16. The oscillating sensor according to claim 7, wherein the calibration unit is configured to provide the predetermined set of evenly distributed cycle frequencies by means of a linear feedback shift register providing pseudo-random numbers and to associate a corresponding cycle frequency to each of the pseudo-random numbers.

17. The oscillating sensor according to claim 1, wherein the resonance circuit has a sensing coil and/or a sensing capacitor.

18. A measurement device comprising the oscillating sensor of claim 1 and an analyzing circuit which is configured to receive an indication of the oscillation signal and to provide an amplitude signal as a sensor signal indicating an amplitude of the oscillation signal.

19. The measurement device according to claim 18, wherein the resonance circuit has a sensing coil for detecting a conductive object being in a sensing range of the sensing coil.

20. Method for operating an oscillation sensor comprising an oscillator comprising a resonance circuit for providing an oscillation signal, a gain stage configured to feed back to the resonance circuit to inject energy for excitation of the resonance circuit to maintain oscillation, and at least one calibration element to adjust an open loop gain of the oscillator, wherein an electrical measure of the at least one calibration element is adjusted based on at least one predetermined duty cycle of a modulated calibration control signal characterized in that the modulated calibration control signal has an irregularly time-varying cycle frequency, wherein the irregularly time-varying cycle frequency is carried out without having an effect on the at least one predetermined duty cycle.

* * * * *